United States Patent
Zamborelli et al.

(12)

(10) Patent No.: US 6,175,228 B1
(45) Date of Patent: Jan. 16, 2001

(54) ELECTRONIC PROBE FOR MEASURING HIGH IMPEDANCE TRI-STATE LOGIC CIRCUITS

(75) Inventors: Thomas J. Zamborelli; Steven D. Draving, both of Colorado Springs, CO (US)

(73) Assignee: Agilent Technologies, Palo Alto, CA (US)

( * ) Notice: Under 35 U.S.C. 154(b), the term of this patent shall be extended for 0 days.

(21) Appl. No.: 09/183,468

(22) Filed: Oct. 30, 1998

(51) Int. Cl.[7] ............................. G01R 31/02; G01R 1/06
(52) U.S. Cl. ........................ 324/72.5; 324/149; 324/754
(58) Field of Search .................................. 324/72.5, 149, 324/754; 333/81 A

(56) References Cited

U.S. PATENT DOCUMENTS 4,743,839 * 5/1988 Rush ..................................... 324/72.5
5,107,201 * 4/1992 Ogle ..................................... 324/72.5
5,172,051 * 12/1992 Zamborelli .......................... 324/72.5

* cited by examiner

*Primary Examiner*—Safet Metjahic
*Assistant Examiner*—Russell M. Kobert
(74) *Attorney, Agent, or Firm*—Patrick J. Murphy

(57) ABSTRACT

An improved probe for probing high speed, low impedance bus structures. The probe comprises an AC termination portion and an RCR filter. In a first embodiment, the AC termination portion comprises a resistor and capacitor in series. The time constant formed by the AC termination portion is sufficiently larger than the time it takes a signal to travel through the cable of the probe. The RCR filter comprises two resistors in series disposed between the AC termination resistor and ground. A capacitor is connected in parallel to the first resistor in order to achieve a flat pulse response from DC through to high frequencies.

7 Claims, 4 Drawing Sheets

ELECTRONIC PROBE FOR MEASURING HIGH IMPEDANCE TRI-STATE LOGIC CIRCUITS

FIELD OF THE INVENTION

The present invention relates generally to test and measurement instruments and more particularly to a probe having low impedance at high frequencies and high impedance at low frequencies.

BACKGROUND OF THE INVENTION

A typical measurement device designed to analyze tri-state logic systems which includes a low impedance probe (i.e., the probe is low impedance at all frequencies) will cause a floating data bus to be "tri-stated" when the probe is attached to the bus. That is, high speed, low impedance (~50 ohm) bus structures may tri-state to high impedances when a drive stops driving the bus. The low impedance probe may pull down the line depending on the value of the pull up resistors.

SUMMARY OF THE INVENTION

The present invention provides an improved probe for probing high speed, low impedance bus structures, for example. The probe comprises an AC termination portion and an RCR filter. In a first embodiment, the AC termination portion comprises a resistor and capacitor in series. The time constant formed by the AC termination portion is sufficiently larger than the time it takes a signal to travel through the cable of the probe. In a second embodiment, the resistor and capacitor are joined in series by an inductor in order to control the peak response of the probe.

The RCR filter comprises two resistors in series disposed between the AC termination resistor and ground. A capacitor is connected in parallel to the first resistor in order to achieve a flat pulse response from DC through to high frequencies.

DETAILED DESCRIPTION OF THE PREFERRED EMBODIMENT

Briefly, the present invention provides an improved probe for testing circuits, particularly circuits which have high speed and low impedance such as a data bus. The probe comprises an AC termination portion and a RCR filter.

Figure 1:
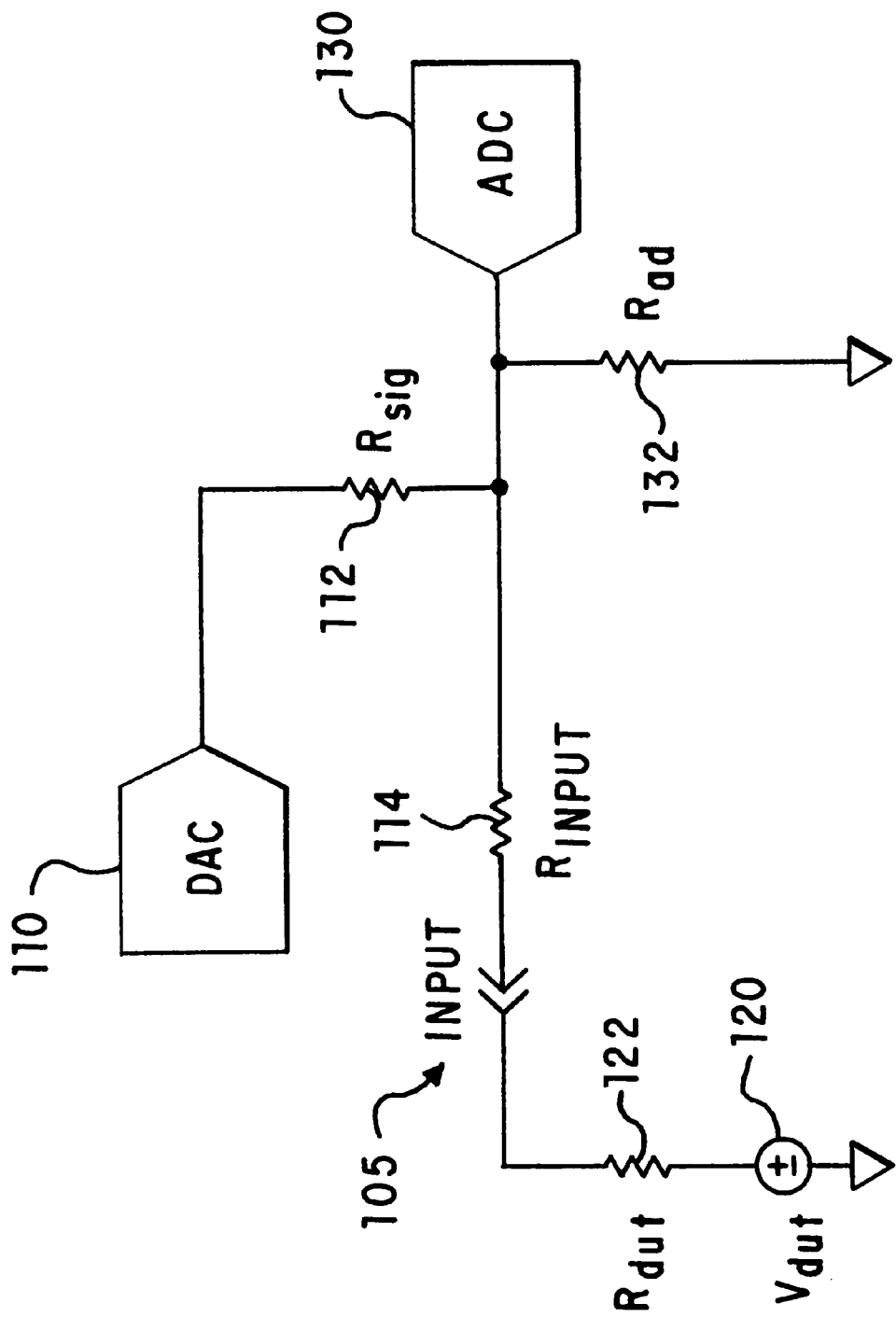
FIG. 1 shows a simplified circuit diagram for measuring signals on a device under test (DUT) using the probe of the present invention.

FIG. 1 shows a simplified circuit diagram for measuring signals on a device under test (DUT) using the probe of the present invention. For example, if the input to the measurement system is open, which is equivalent to $R_{dut}$ 122 being infinite, the measured voltage at the analog-to-digital converter (ADC) 130 is controlled solely by the signal generated by the digital-to-analog converter (DAC) 110 and resistors $R_{sig}$ 112 and $R_{ad}$ 132. The DAC 110 is dithered a small amount sufficient to be measured by the ADC 130 while not significantly impacting the measurement system, for example, below 1 count in the output display of the measurement system.

If there is a load on the input to the measurement system, then $R_{dut}$ 122 can be modeled as some finite value. This causes the signal from the DAC 110 that is measured by the ADC 130 to be attenuated by the additional loading of Rdut 122 and $R_{input}$ 114. At some predetermined threshold of attenuation, the input is no longer considered open. In another preferred embodiment, the DAC 110 can be replaced by a signal generator.

Figure 2:
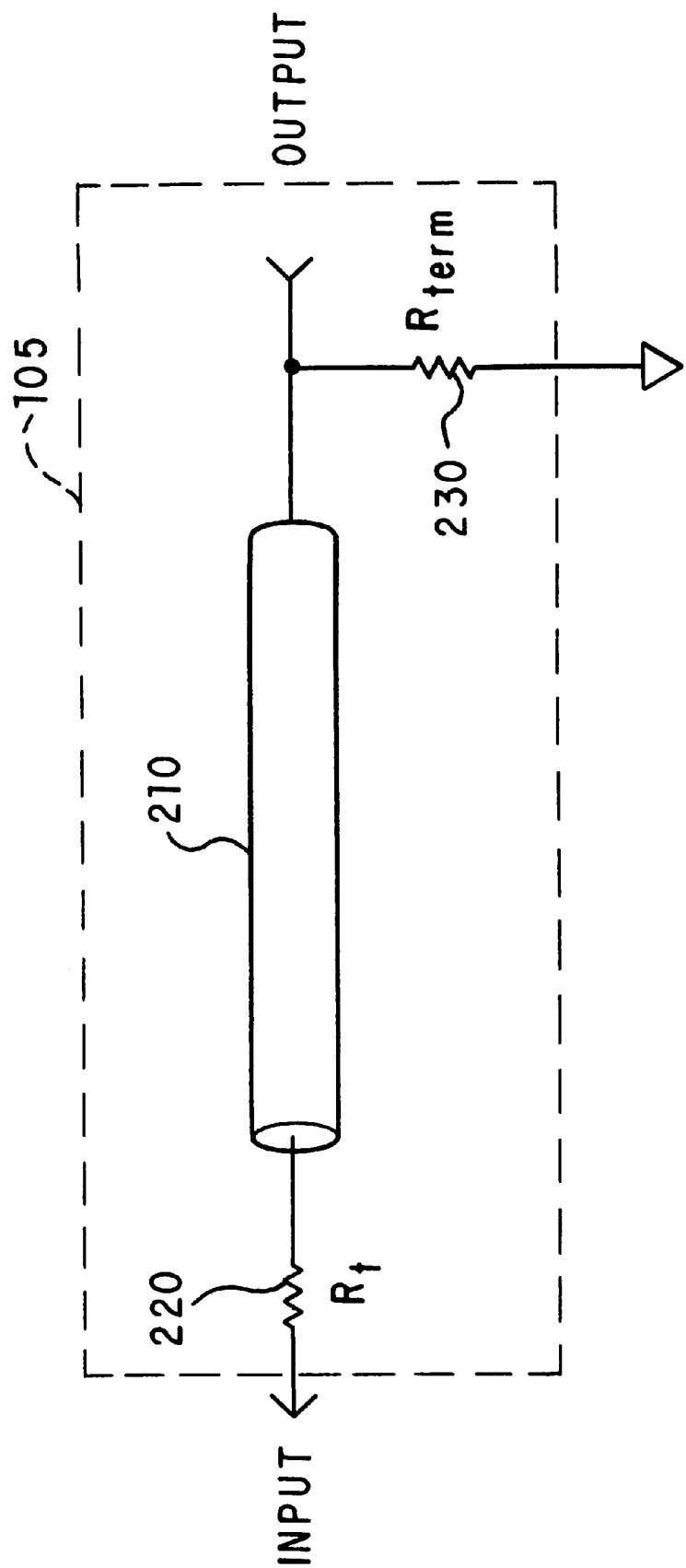
FIG. 2 shows a simple circuit diagram of a low impedance probe.

FIG. 2 shows a simple circuit diagram of a low impedance probe comprising a tip resistor, $R_t$ 220, a coaxial cable 210, and a termination resistor, $R_{term}$ 230. The input signal is transmitted to the measurement device (not shown) through $R_t$ 220. The first end of $R_t$ 220 is connected to the probe tip, while the second end of $R_t$ 220 is connected to the first end of the coaxial cable 210. The cable 210 provides the necessary grounding for the probe through $R_{term}$ 230. An external attenuated signal, OUTPUT, is then brought into the measurement device.

Figure 3A:
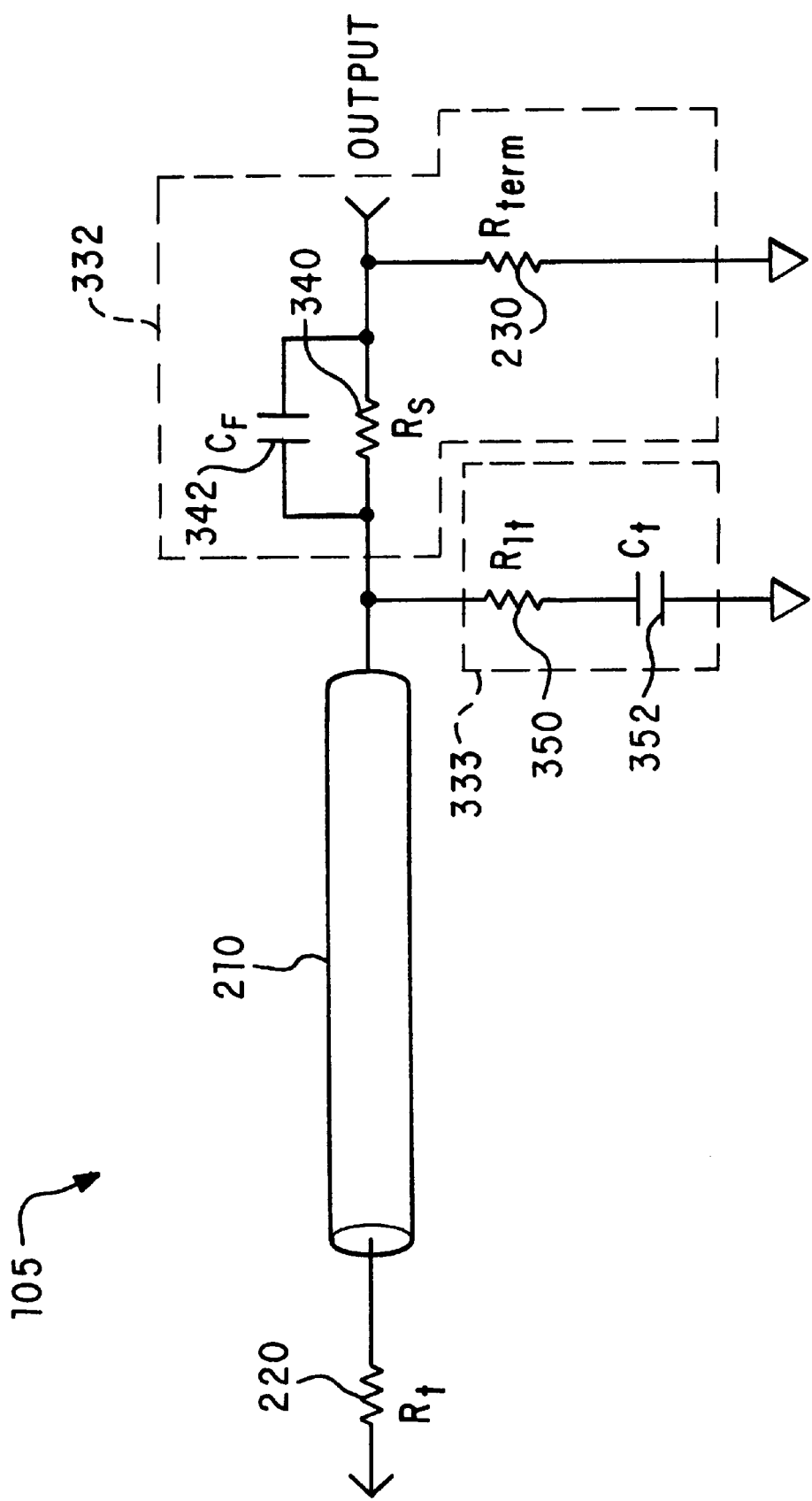
FIG. 3a shows an improved probe according to the present invention.

FIG. 3a shows an improved probe according to the present invention. An AC termination portion 333 comprises a capacitor, $C_t$ 352, added in series with an AC termination resistor, now $R_t$ 350. The value of $C_t$ 352 is chosen so that the time constant formed with $R_t$ 350 is much larger than the transit time through cable 210. The probe characteristics can now be favorably compared to a low pass filter. In other words, this probe will show a unity gain at DC and a fraction of that gain at high frequencies provided that the impedance of $R_t$ 220 and the impedance at $C_t$ 352 are approximately equal.

A high pass RCR filter 332 provides compensation resulting in a wide bandwidth, flat pulse response. This added filter 332 provides the same attenuation at DC as the AC termination provides at high frequencies. The filter 332 comprises two resistors in series, $R_s$ 340 and $R_{term}$ 230. The first end of $R_s$ 340 is connected to the AC termination resistor $R_t$ 350. The second end of $R_s$ 340 is connected to the first end of $R_{term}$ 230. The second end of $R_{term}$ is tied to ground. Having the RCR filter 332 provide the same attenuation at DC as the AC termination 333 provides at high frequencies is achieved by matching the pole set by $C_t$ 352 to the zero set by $C_f$ 342. In other words, the time constant of the AC termination 333 is approximately equal to the time constant of the RCR filter 332.

Capacitor $C_f$ 342 is connected in parallel to $R_s$ 340 in order to effect a high pass filter. The time constant of this parallel combination must be equal to the time constant of the tip resistor, $R_t$ 220 and the AC termination capacitor, $C_t$ 352, in order to achieve a flat response from DC to high frequencies.

Figure 3B:
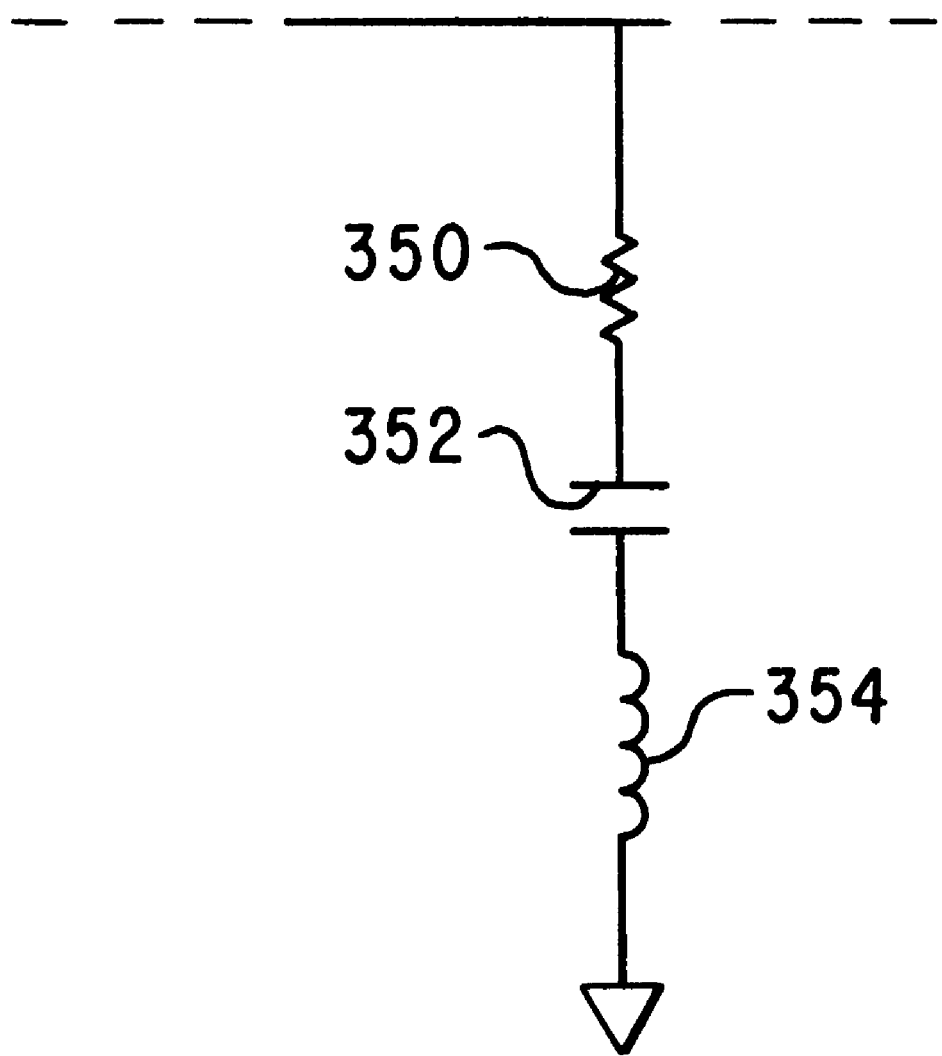
FIG. 3b shows another embodiment of the improved probe.

FIG. 3b shows another embodiment of the improved probe according to the present invention. The AC termination resistor 350 and capacitor 352 are joined in series by inductor 354. The inductor 354 accommodates for the effect that the input capacitance of an amplifier or comparator has on the probe termination. Inductor 354 is chosen to peak the response which the amplifier or comparator tend to roll off.

While the present invention has been illustrated and described in connection with the preferred embodiments, it is not to be limited to the particular structures shown. It should be understood by those skilled in the art that various changes and modifications may be made within the purview of the appended claims without departing from the true scope and spirit of the invention in its broader aspects.

What is claimed is:

1. An electronic probe comprising:

a probe tip;

a tip resistor having first and second ends, the first end connected to the probe tip;

a cable having first and second ends, the first end of the cable connected to the second end of the tip resistor;

an AC termination portion having first and second ends, the first end of the AC termination portion connected to the second end of the cable, the second end of the AC termination portion connected to ground, the AC termination portion comprising a resistor and capacitor connected in series between the AC termination first end and second end; and an RCR filter having a first end and a second end, the first end connected to the second end of the cable, and the second end connected to ground;

the RCR filter comprising a first resistor connected between the RCR filter first end and a second resistor, the second resistor connected between the first resistor and the RCR filter second end, and a capacitor connected in parallel with the first resistor.

2. The probe of claim 1 and further comprising an output node located at the junction of the first and second resistors of the RCR filter.

3. The probe of claim 1 wherein the time constant of the AC termination portion is greater than the transit time through the cable.

4. The probe of claim 1 wherein said AC termination has a time constant associated therewith and wherein said RCR filter has a time constant associated therewith, and wherein said AC termination time constant is approximately equal to said RCR filter time constant.

5. The probe of claim 1 wherein the AC termination portion further comprises an inductor connected in series with the resistor and the capacitor.

6. The probe of claim 1 wherein the probe has a gain associated therewith and wherein the gain is approximately uniform from DC to a preselected frequency.

7. The probe of claim 1 wherein said tip resistor comprises a single electronic component.

* * * * *